(12) United States Patent
Böhm et al.

(10) Patent No.: US 6,353,562 B2
(45) Date of Patent: Mar. 5, 2002

(54) INTEGRATED SEMICONDUCTOR MEMORY WITH REDUNDANT UNITS FOR MEMORY CELLS

(75) Inventors: Thomas Böhm, Zorneding (DE); Heinz Hönigschmid, East Fishkill, NY (US); Stefan Lammers, München (DE); Zoltan Manyoki, CDN-Kanada (CA)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/780,326

(22) Filed: Feb. 9, 2001

(30) Foreign Application Priority Data

Feb. 9, 2000 (DE) .......................................... 100 05 618

(51) Int. Cl.[7] .............................................. G11C 7/00
(52) U.S. Cl. ...................................... 365/200; 365/201
(58) Field of Search ................................. 365/200, 201, 365/189.07

(56) References Cited

U.S. PATENT DOCUMENTS

| | | | |
|---|---|---|---|
| 5,644,529 A | * | 7/1997 | Pascucci et al. ....... 365/189.07 |
| 5,732,029 A | * | 3/1998 | Lee et al. .................... 365/200 |
| 6,023,433 A | | 2/2000 | Koshikawa |
| 6,178,124 B1 | * | 1/2001 | Kaiser et al. ............... 365/200 |

* cited by examiner

Primary Examiner—Huan Hoang
(74) Attorney, Agent, or Firm—Herbert L. Lerner; Laurence A. Greenberg; Werner H. Stemer

(57) ABSTRACT

An integrated semiconductor memory has memory cells that are combined to form addressable normal units and to form at least one redundant unit for replacing one of the normal units. In addition, the semiconductor memory has an address bus to which an address can be applied, and a redundancy circuit that is connected to the address bus. The redundancy circuit is used to select the redundant unit. An input of a processing unit is connected to a connection of the address bus and also to a connection for a test signal, and the output of the processing unit is connected to an input of the redundancy circuit. The redundant unit can be tested before the repair information is programmed in the redundancy circuit. The circuit complexity required for this is comparatively low.

9 Claims, 3 Drawing Sheets

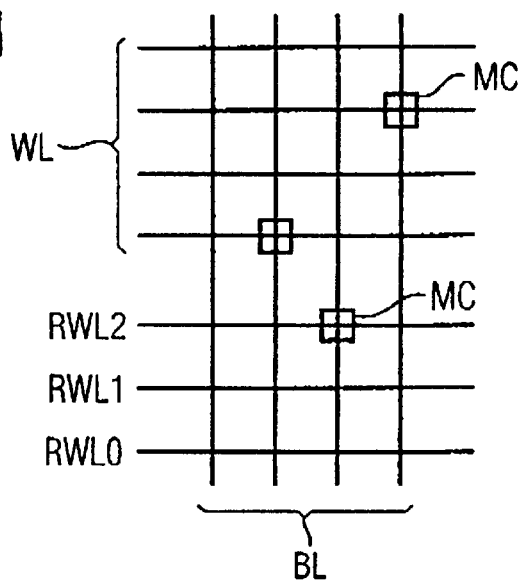
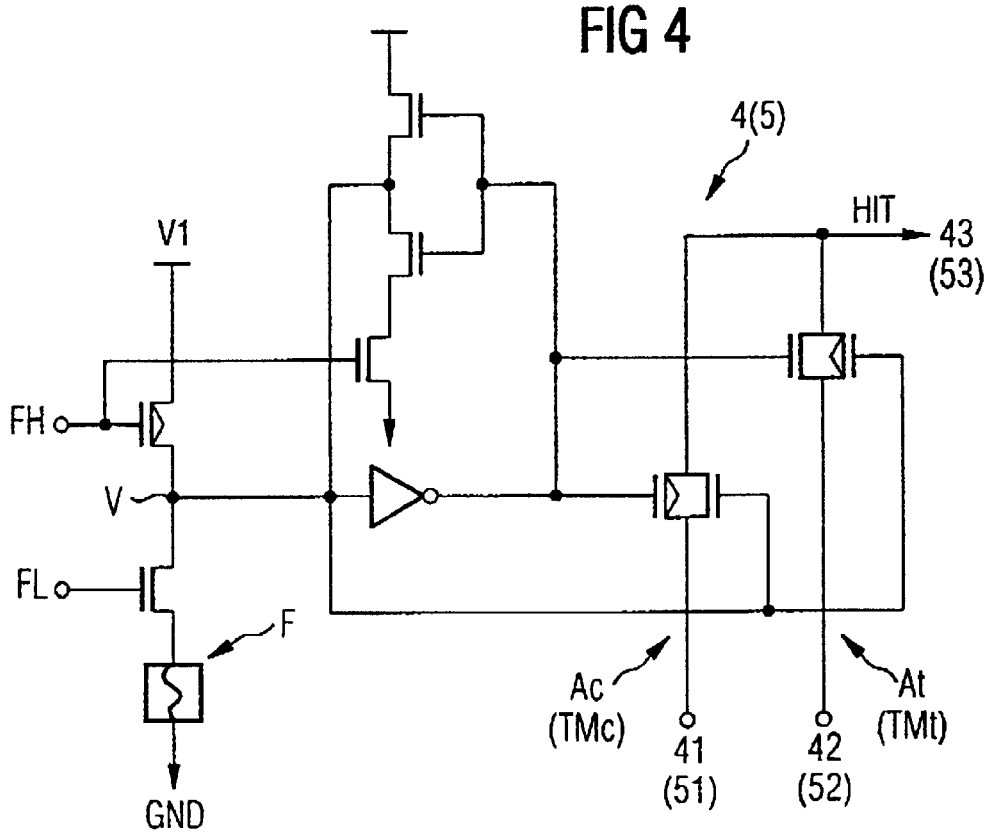

INTEGRATED SEMICONDUCTOR MEMORY WITH REDUNDANT UNITS FOR MEMORY CELLS

BACKGROUND OF THE INVENTION

FIELD OF THE INVENTION

The present invention relates to an integrated semiconductor memory having memory cells that are combined to form addressable normal units and to form at least one redundant unit for replacing one of the normal units. The memory has an address bus to which an address can be applied, and a redundancy circuit, which is connected to the address bus, for selecting the redundant unit.

For the purpose of repairing faulty memory cells, integrated semiconductor memories generally have redundant units of memory cells that are able to replace normal units of memory cells containing faulty memory cells by addressing. In this context, the integrated memory is tested, for example using an external testing device or a self-test device, and the redundant elements are then programmed. For this, a redundancy circuit has programmable elements, for example in the form of laser fuses or electrically programmable fuses, which are used to store the address of a unit that needs to be replaced. The programmable elements are programmed using a laser beam or a so-called burning voltage, for example in the course of the production process of the memory.

During the operation of the semiconductor memory, the normal units that need to be replaced are replaced, by addressing, the appropriate redundant units in the course of a memory access operation. At the start of the memory access operation, redundancy evaluation is carried out in the redundancy circuits within a selected memory area. To this end, by way of example, an address for the selected normal unit is applied to an address bus, and the applied address is then compared with an address for a faulty normal unit, which is stored in the respective redundancy circuit. Following the comparison, each of the redundancy circuits supplies a signal containing information about whether the applied address matches the address stored in the respective redundancy circuit. If there is a match, the appropriate redundancy circuit selects the associated redundant unit.

So that faulty normal units of memory cells in a semiconductor memory are replaced only by fault-free redundant units, it is expedient for not only the normal units of memory cells but also the redundant units of memory cells to be tested to ensure that they are free from faults. Such a test should be carried out before the programmable elements of the redundancy circuits are programmed by a laser, for example. In general, additional circuit complexity on the semiconductor memory is required for carrying out the test mode. In this case, it is beneficial for the additionally required circuit complexity to be comparatively low, in the interests of a low space requirement on the semiconductor memory.

SUMMARY OF THE INVENTION

It is accordingly an object of the invention to provide an integrated semiconductor memory with redundant units for memory cells which overcomes the above-mentioned disadvantages of the prior art devices of this general type, in which a redundant unit of memory cells can be tested and in which the circuit complexity required for this is comparatively low.

With the foregoing and other objects in view there is provided, in accordance with the invention, an integrated semiconductor memory. The memory contains memory cells which are combined to form addressable normal units and further memory cells which are combined to form at least one redundant unit for replacing one of the addressable normal units. An address bus to which an address can be applied and has connection points is provided. A redundancy circuit is connected to the address bus and stores the address for one of the addressable normal units which is to be replaced by the redundant unit, the redundancy circuit having inputs and compares the address on the address bus with a stored address. The redundancy circuit selects the redundant unit if a match is established between the stored address and the address on the address bus. A processing unit is provided and has a first input connected to one of the connection points of the address bus, a second input receiving a test signal, and an output connected to one of the inputs of the redundancy circuit. The processing unit modifies an address signal only for a defined state of the test signal.

The object is achieved by an integrated semiconductor memory having memory cells that are combined to form addressable normal units. Further memory cells are combined to form at least one redundant unit for replacing one of the normal units. An address bus is provided to which an address can be applied. A redundancy circuit is provided, which is connected to the address bus, for storing an address for the normal unit that needs to be replaced by the redundant unit. The redundancy circuit compares the address that is on the address bus with the stored address, and selects the redundant unit if a match is established. A processing unit whose input is connected to a connection of the address bus and to a connection for a test signal is provided. The processing unit has an output connected to an input of the redundancy circuit, and which modifies an address signal only for a defined state of the test signal.

In the semiconductor memory according to the invention, existing address lines are used to select the redundant unit of memory cells during a test mode. In the case of such a redundancy test configuration, there is no need for, by way of example, an additional decoder or an additional selection line selecting the redundant unit of memory cells. To select the redundant unit in the test mode, the address lines and also the redundancy circuit that is likewise present are used. The redundancy circuit has not (yet) been programmed for the purpose of testing the redundant unit. The processing unit connected upstream of the redundancy circuit does not modify an address signal present at the input of the redundancy circuit in normal operation. An appropriate test signal modifies an address signal in the test mode only. In one simple embodiment, the processing unit may be in the form of a logic gate, for example. The additional circuit complexity required for the test mode is thus comparatively low.

The invention is suitable for any semiconductor memories in which faulty units of memory cells are repaired using redundant units of memory cells. The normal units are, by way of example, regular word lines or bit lines, and the redundant units are redundant word lines or bit lines. However, instead of replacing individual word lines or bit lines, it is also possible to replace larger units of memory cells, for example individual memory cell blocks, with appropriate redundant units.

In accordance with an added feature of the invention, the address on the address bus contains a plurality of address bits. Each of the connection points of the address bus is provided for each of the address bits. Each of the inputs of the redundancy circuit is provided for each of the address bits. The processing unit is connected to one of the connection points of the address bus and to one of the inputs of the redundancy circuit.

In accordance with an additional feature of the invention, the redundancy circuit contains memory circuits according to a number of the address bits, each of the memory circuits has a programmable element and at least one input connected to one of the inputs of the redundancy circuit.

In accordance with a further feature of the invention, the redundancy circuit has a further memory circuit with a programmable element, the further memory circuit contains information about whether information stored in the memory circuits is valid.

In accordance with another feature of the invention, the further memory circuit has at least one input receiving the test signal.

In accordance with a further added feature of the invention, each of the memory circuits and the further memory circuit has a first input for a logic signal and a second input for a complementary logic signal which is complementary to the logic signal.

In accordance with another added feature of the invention, each of the memory circuits has a respective output for an output signal which has a state of the complementary logic signal when the programmable element has been programmed, and a state of the logic signal when the programmable element has not been programmed.

In accordance with another additional feature of the invention, the programmable element contains a laser fuse.

In accordance with a concomitant feature of the invention, the redundant unit is one of a plurality of redundant units for replacing the normal units. The processing unit is one of a plurality of processing units. The redundancy circuit is one of a plurality of redundancy circuits, each of the redundancy circuits has an associated one of the processing units. The processing units are each connected to a different one of the connection points of the address bus and are each connected to a different one of the inputs of the redundancy circuits.

Other features which are considered as characteristic for the invention are set forth in the appended claims.

Although the invention is illustrated and described herein as embodied in an integrated semiconductor memory with redundant units for memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic illustration of a matrix-like memory cell array;

FIG. 4 is a circuit diagram of a memory circuit shown in FIG. 3.

DESCRIPTION OF THE PREFERRED EMBODIMENTS

Figure 2:
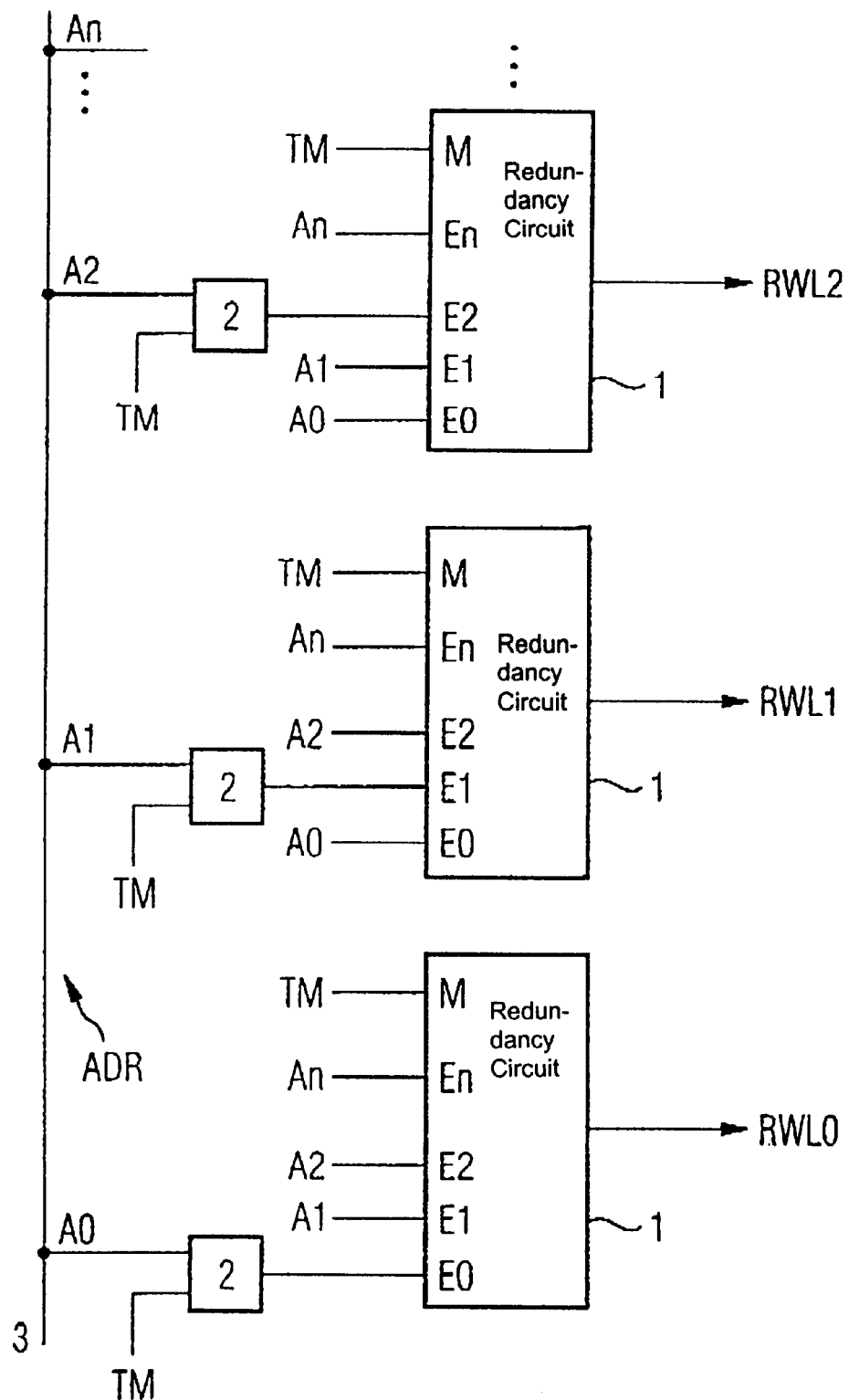
FIG. 2 is a block circuit diagram of an embodiment of a semiconductor memory according to the invention.

In all the figures of the drawing, sub-features and integral parts that correspond to one another bear the same reference symbol in each case. Referring now to the figures of the drawing in detail and first, particularly, to FIG. 1 thereof, there is shown a memory cell array organized in the form of a matrix. For example, a memory cell array of a dynamic random access memory (DRAM) which has regular word lines WL and bit lines BL with memory cells MC disposed at their points of intersection. In addition, the memory cell array has redundant word lines RWL0 to RWL2, which likewise have memory cells MC disposed at their points of intersection with the bit lines BL.

The invention can be applied to a semiconductor memory that has only one redundant line, for example, RWL1. In practice, a semiconductor memory generally has a plurality of redundant lines. For the purposes of better understanding, the invention is first explained primarily only in relation to the redundant word line RWL1. The invention can be applied accordingly to the further redundant word lines RWL0 and RWL2.

The memory cells MC of the memory shown each contain a selection transistor and a storage capacitor. In this case, control inputs of the selection transistors are connected to one of the word lines WL and redundant word lines RWL0 to RWL2, while a main current path of the selection transistors is disposed between the storage capacitor in the respective memory cell MC and one of the bit lines BL.

FIG. 2 shows an embodiment of the semiconductor memory according to the invention. The semiconductor memory has an address bus 3 to which an address ADR can be applied. In addition, the semiconductor memory has at least one redundancy circuit 1 for selecting the redundant line RWL1 and is connected to the address bus 3.

By way of example, an address for the word line WL that needs to be replaced by the redundant word line RWL1 is stored in the redundancy circuit 1 for normal operation of the semiconductor memory. During a memory access operation, the address ADR that is on the address bus 3 is compared with the address stored in the redundancy circuit 1. If the stored address matches the address ADR which is on the address bus 3, the redundant line RWL1 in question is selected. Therefore, the word line WL with the address ADR that is on the address bus 3 is replaced by the redundant word line RWL1 by addressing.

The integrated semiconductor memory shown in FIG. 2 also has a processing unit 2 whose input is connected to a connection A1 of the address bus 3 and to a connection for a test signal TM. An output of the processing unit 2 is connected to an input E1 of the redundancy circuit 1.

By way of example, the address ADR that is on the address bus 3 contains a plurality of address bits. Accordingly, the address bus 3 has a plurality of connections A0 to An for one address bit each. The redundancy circuit 1 likewise has a plurality of inputs E0 to En for one address bit each. In accordance with the embodiment shown in FIG. 2, the processing unit 2 is in this case connected to one of the connections A0 to An of the address bus 3 and to one of the inputs E0 to En of the redundancy circuit 1. In addition, the test signal TM is connected to the connection M of the redundancy circuit 1.

When there are a plurality of redundant word lines RWL0 to RWL2 to be tested, the associated redundancy circuits 1 are each allocated one of the processing units 2. In this context, it is possible for one of the redundancy circuits 1 to have no processing unit 2 allocated. In this case, the processing units 2 are each connected to a different connection A0 to An of the address bus 3 and are each connected to a different input E0 to En of the redundancy circuits 1.

FIG. 4 shows an embodiment of a memory circuit 4 contained in a respective one of the redundancy circuits 1. The memory circuit 4 has a programmable element F in the form of a laser fuse F, and also a so-called fuse latch in the form of a hold circuit containing two inverters connected back to back. A node V is first preloaded with a value "1", for example corresponding to the value of an internal supply potential V1, via a PMOS transistor using a signal FH. When a NMOS transistor is subsequently driven using a signal FL, the node V is reset to the value "0", for example corresponding to a reference ground potential GND, or is left in the state "1", depending on the state of the fuse F. If the fuse F has not been blown, then the node V is reset to the reference ground potential GND. On the other hand, if the fuse F has been blown (programmed), then the potential at the node V is maintained. In this case, the state "1" is stored in the fuse latch.

The memory circuit 4 additionally has a respective input 42 for a logic signal At and a respective input 41 for a logic signal Ac, which is the complement thereof. The memory circuit 4 also has an output 43 for an output signal HIT. On the basis of the circuit configuration shown in FIG. 4, the output signal HIT has the state of the complementary logic signal Ac when the programmable element F has been programmed (state "1" stored in the fuse latch). Correspondingly, the output signal HIT has the state of the logic signal At when the programmable element F has not been programmed (state "0", equal to the reference ground potential GND, stored in the fuse latch).

Thus, in normal operation, blowing or programming the programmable element F stores the repair information for an address bit in the memory circuit 4. By way of example, the logic signal At in the form of an address bit is applied to the input 42, and the logic signal Ac, which is the complement thereof, in the form of the inverted address bit is applied to the input 41. If the programmed repair information in the fuse latch F matches the applied address bit, the output signal HIT has an active state, for example. Assuming that the fuse F has been blown or programmed, the output signal HIT has the active state HIT=0 for a signal At=1. Therefore, if the fuse F has been blown, the inverted address bit reaches the output 43 of the memory circuit 4.

Figure 3:
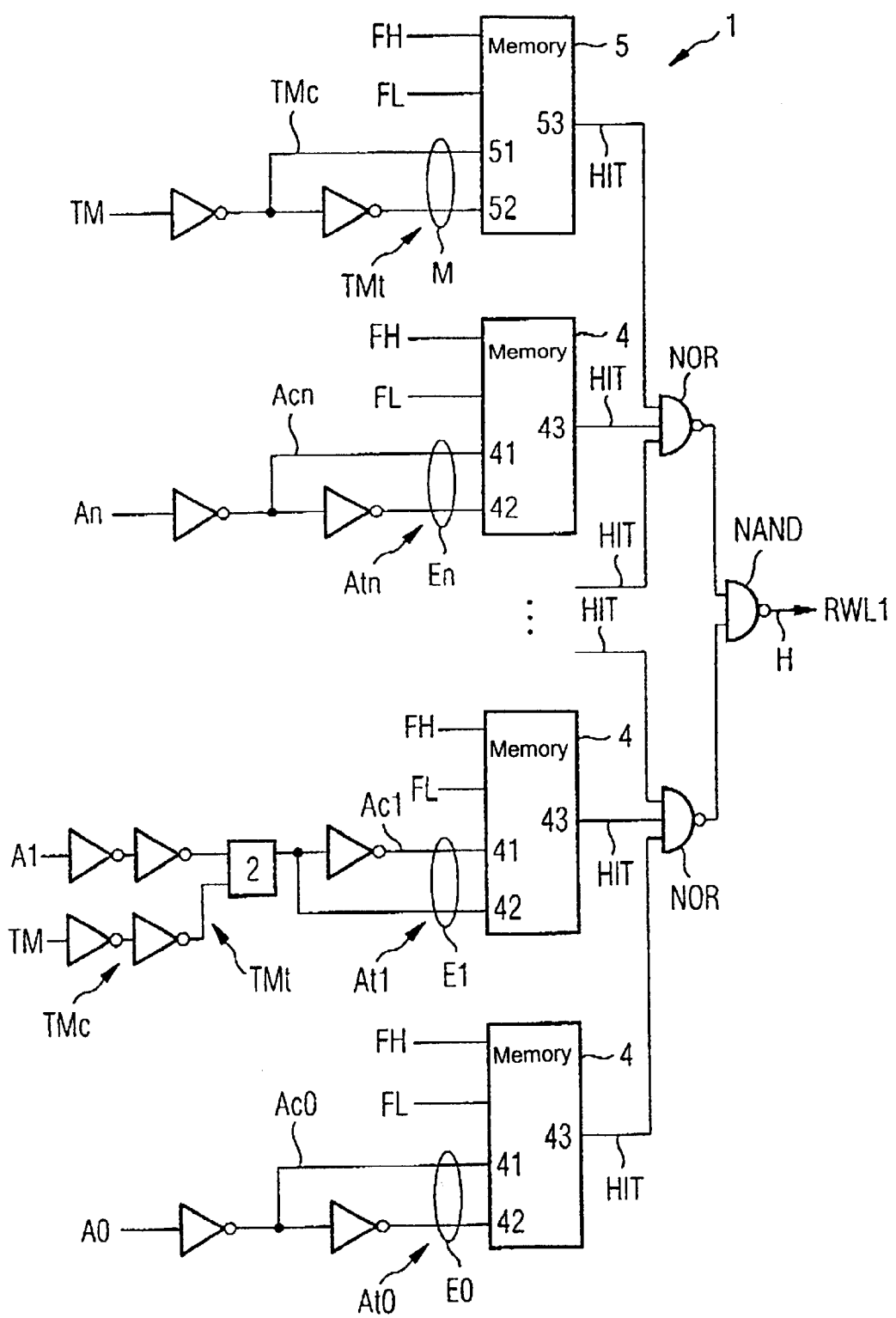
FIG. 3 is a block circuit diagram of an embodiment of a redundancy circuit shown in FIG. 2.

FIG. 3 shows an embodiment of the redundancy circuit 1 shown in FIG. 2. The redundancy circuit 1 contains the memory circuits 4 according to the number of address bits. In this context, at least the input 42 is connected to one of the inputs E0 to En of the redundancy circuit 1 in each case. The respective input 41 is connected to a connection having the respective signal that is the complement thereof.

In one embodiment, the redundancy circuit 1 has a further memory circuit 5, which contains information about whether the information stored in the memory circuits 4 for the redundancy circuit 1 is valid. In this case, the circuitry of the further memory circuit 5 is configured as for the memory circuit 4 shown in FIG. 4. In this context, an input 52 is connected to the test signal TMt, and an input 51 is connected to a test signal TMc, which is the complement thereof.

The memory circuit 5 is also referred to as a so-called master fuse latch. It is activated if the stored repair information in the redundancy circuit 1 is valid. Therefore, the appropriate redundant line RWL0 to RWL2 is selected only if all the memory circuits 4, including the memory circuit 5, have an active output signal HIT=0.

The way in which the inventive semiconductor memory in accordance with the embodiments shown in FIGS. 1 to 4 works during a test mode is explained in more detail below.

The redundant line RWL1, for example, is tested before the programmable elements F of the memory circuits 4 are programmed using a laser. Therefore, the repair information has not yet been programmed, and accordingly the memory circuit 5 (master fuse latch) has also not been programmed. To activate the redundancy circuit 1 for selecting the redundant line RWL1, a signal At=0 and hence the signal Ac=1 need to be applied to all the memory circuits 4 of the redundancy circuit 1. Therefore, the output signal HIT has the state active HIT=0 at each of the outputs 43 of the memory circuits 4. Furthermore, the test signal TM=TMt=0 and hence the signal TMc=1 are applied for the test mode. Therefore, the output 53 of the memory circuit 5 also has an active output signal HIT=0.

To select only the redundancy circuit 1 for selecting the redundant line RWL1, an appropriate address ADR is applied to the address bus 3. The address ADR has the state "0" for the address bits on the connections A0 and A2 to AN, and has the state "1" for the address bit on the connection A1. The address ADR 32 0 . . . 010 is thus on the address bus 3. An XNOR function in the processing unit 2 is used to produce an output signal At1 having the state "0" from the address bit on the connection A1 and from the test signal TM. Therefore, the address bit on the connection A1 is inverted in the processing unit 2. Consequently, signals having the state "0" are applied to all the inputs 42 of the memory circuits 4, and the output signals HIT=0 are then activated. Similarly, the output signal HIT from the memory circuit 5 is activated by the test signal TMt=0. Since all the output signals HIT from the memory circuits 4 and 5 have been activated, the redundant line RWL1 is selected by an appropriate signal H.

Since the respective processing units 2 of the respective redundancy circuits 1 for selecting different redundant lines RWL0 to RWL2 are each connected to a different connection A0 to AN of the address bus 3 and are each connected to a different input E0 to En of the redundancy circuit 1, the applied address ADR selects only the redundancy circuit 1 for selecting the redundant line RWL1 for the test mode.

If repair information is stored in the redundancy circuits 1 for normal operation of the integrated memory, then the test signal TM can turn off selection of the appropriate redundant line even after the repair information has been programmed. The programmable element F of the memory circuit 5 has been programmed when the repair information is written to the redundancy circuit 1. Applying a test signal TMt=0 to the input 52 and applying the test signal TMc=1 to the input 51 of the memory circuit 5 produces the output signal HIT=1. This output signal is thus in an inactive state. Hence, no output signal H from the redundancy circuit 1 is produced for selecting one of the redundant lines RWL0 to RWL2. The corresponding redundant line can thus also be deactivated after the repair information has been programmed, for example for test purposes.

We claim:

1. An integrated semiconductor memory, comprising:

memory cells which are combined to form addressable normal units;

further memory cells which are combined to form at least one redundant unit for replacing one of said addressable normal units;

an address bus to which an address can be applied and having connection points;

a redundancy circuit connected to said address bus and storing the address for one of said addressable normal units which is to be replaced by said redundant unit, said redundancy circuit having inputs and compares the address on said address bus with a stored address, and said redundancy circuit selecting said redundant unit if a match is established between the stored address and the address on said address bus; and a processing unit having a first input connected to one of said connection points of said address bus, a second input receiving a test signal, and an output connected to one of said inputs of said redundancy circuit, said processing unit modifying an address signal only for a defined state of the test signal.

2. The integrated semiconductor memory according to claim 1, wherein:

the address on the address bus contains a plurality of address bits;

each of said connection points of said address bus provided for one of the address bits;

each of said inputs of said redundancy circuit provided for one the address bits; and said processing unit is connected to one of said connection points of said address bus and to one of said inputs of said redundancy circuit.

3. The integrated semiconductor memory according to claim 2, wherein said redundancy circuit contains memory circuits according to a number of the address bits, each of said memory circuits having a programmable element and at least one input connected to one of said inputs of said redundancy circuit.

4. The integrated semiconductor memory according to claim 3, wherein said redundancy circuit has a further memory circuit with a programmable element, said further memory circuit containing information about whether information stored in said memory circuits is valid.

5. The integrated semiconductor memory according to claim 4, wherein said further memory circuit has at least one input receiving the test signal.

6. The integrated semiconductor memory according to claim 4, wherein each of said memory circuits and said further memory circuit have a first input for a logic signal and a second input for a complementary logic signal which is complementary to the logic signal.

7. The integrated semiconductor memory according to claim 6, wherein each of said memory circuits has a respective output for an output signal which has a state of the complementary logic signal when said programmable element has been programmed, and a state of the logic signal when said programmable element has not been programmed.

8. The integrated semiconductor memory according to claim 3, wherein said programmable element contains a laser fuse.

9. The integrated semiconductor memory according to claim 2, wherein:

said redundant unit is one of a plurality of redundant units for replacing said normal units;

said processing unit is one of a plurality of processing units;

said redundancy circuit is one of a plurality of redundancy circuits, each of said redundancy circuits has an associated one of said processing units; and said processing units are each connected to a different one of said connection points of said address bus and are each connected to a different one of said inputs of said redundancy circuits.

* * * * *